United States Patent
Karin

(10) Patent No.: US 10,498,217 B1
(45) Date of Patent: Dec. 3, 2019

(54) COORDINATED POWER CONVERTERS FOR INCREASED EFFICIENCY AND POWER ELECTRONICS LIFETIME

(71) Applicant: PALO ALTO RESEARCH CENTER INCORPORATED, Palo Alto, CA (US)

(72) Inventor: Todd Karin, Fairfield, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 0 days.

(21) Appl. No.: 16/216,694

(22) Filed: Dec. 11, 2018

Related U.S. Application Data

(60) Provisional application No. 62/693,236, filed on Jul. 2, 2018.

(51) Int. Cl.
| | |
|---|---|
| *H02M 1/12* | (2006.01) |
| *H02M 7/00* | (2006.01) |
| *H02M 7/49* | (2007.01) |

(52) U.S. Cl.
CPC ............ *H02M 1/12* (2013.01); *H02M 7/003* (2013.01); *H02M 7/006* (2013.01); *H02M 7/49* (2013.01)

(58) Field of Classification Search
CPC ......... H02M 2007/4822; H02M 7/493; H02M 7/497; H02M 7/501; H02M 1/12; H02M 1/14; H02M 1/15; H02M 7/49

(Continued)

(56) References Cited

U.S. PATENT DOCUMENTS

| | | | |
|---|---|---|---|
| 5,193,054 A | * | 3/1993 | Galloway ................. H02J 4/00 307/82 |
| 5,345,375 A | | 9/1994 | Mohan |

(Continued)

OTHER PUBLICATIONS

Benaifa et al., "Analysis of Harmonic Reduction for Synchronized Phase-shifted Parallel PWM Inverters with Current Sharing Reactors," 2007 IEEE Canada Electrical Power Conference, pp. 134-139.

(Continued)

*Primary Examiner* — Alex Torres-Rivera
(74) *Attorney, Agent, or Firm* — Miller Nash Graham and Dunn

(57) ABSTRACT

A method of controlling a plurality of power converters in a power system includes controlling switching times on the plurality of power converters receiving an input using a master controller, such that at least one of the plurality of power converters switches at a different time than at least one other of the plurality of power converters to provide a summation of outputs at a coupling point, and adjusting control signals from the master controller to each power converter to control the summation of the outputs to a desired output. A method of controlling a plurality of power converters in a power system includes determining a base frequency, assigning an operating frequency to the power converters, wherein the operating frequency is a multiple of the base frequency, to each of the power converters, operating the plurality of power converters at the assigned frequencies, and summing the individual outputs of the power converters to produce an output. A method, of tuning a set of power converters includes assigning switch times to each of the power converters so that at least one of the power converters switches at a different time than at least one other power converter, wherein updates to the switching times do not require additional communications.

13 Claims, 8 Drawing Sheets

(58) Field of Classification Search
USPC .............................................. 363/65, 69, 72
See application file for complete search history.

(56) References Cited

U.S. PATENT DOCUMENTS

| | | | | |
|---|---|---|---|---|
| 5,434,771 | A * | 7/1995 | Danby | H02M 7/493 |
| | | | | 363/41 |
| 2004/0208029 | A1* | 10/2004 | Caruthers | G08C 19/00 |
| | | | | 363/72 |
| 2006/0245221 | A1* | 11/2006 | Ohshima | H02M 7/493 |
| | | | | 363/131 |
| 2009/0185400 | A1* | 7/2009 | Okui | H02M 7/493 |
| | | | | 363/71 |
| 2009/0283129 | A1 | 11/2009 | Foss | |
| 2012/0113696 | A1 | 5/2012 | Voightlaender | |
| 2012/0307528 | A1* | 12/2012 | Humphrey | H02M 3/33592 |
| | | | | 363/17 |
| 2013/0033907 | A1 | 2/2013 | Zhou et al. | |
| 2013/0320767 | A1 | 12/2013 | Huang et al. | |
| 2016/0006392 | A1 | 1/2016 | Hoft | |
| 2017/0054297 | A1 | 2/2017 | Narla et al. | |
| 2017/0294864 | A1* | 10/2017 | Tada | H02P 29/50 |
| 2019/0036141 | A1* | 1/2019 | Yamane | H01M 8/04858 |

OTHER PUBLICATIONS

Bierk et al., "Characterization of Distortion Reduction for Single0Phase Multiple Inverter Operation," 2007 IEEE Canadian Conference on Electrical and Computer Engineering, Vancouver, BC, pp. 713-716.
U.S. Appl. No. 16/216,712, filed Dec. 11, 2018.

\* cited by examiner

US 10,498,217 B1

COORDINATED POWER CONVERTERS FOR INCREASED EFFICIENCY AND POWER ELECTRONICS LIFETIME

RELATED APPLICATIONS

This application is a continuation of, and claims priority to, U.S. Provisional Patent Application No. 62/693,236, filed 2 Jul. 2018, which is incorporated by reference in here in its entirety.

TECHNICAL FIELD

This disclosure relates to power converters, more particularly to increasing efficiency while maintaining or reducing total harmonic distortion in power converters.

BACKGROUND

Power converters include items such as solar power inverters, charging systems for electric vehicles (EV), converters used in wind turbines, power supplies for electronics, and others. Generally, they are used to convert direct current (DC) power to alternating current (AC) power, or AC power to DC. In many types of power converters, for example those using pulse width modulation, a relatively fast (typically 2-20 KHz) modulation frequency is required in order to keep the total harmonic distortion (THD) within regulated limits. These fast switching speeds lead to significant switching losses in the transistors that affect overall conversion efficiency. These losses result in heat generation in the transistors, often leading to thermal cycling that reduces the lifetime of the electronics.

One prior-art approach improves the total harmonic distortion from a single converter by controlling the firing angle of a pulse-width modulated (PWM) sequence, as discussed in US Patent Publication No. 2013/0033907. One can also interleave the firing angles from multiple inverters in the solar power case to generate low harmonic current using minimal active/passive filters as discussed in US Patent Publication No. 2009/0283129. Another approach uses active current injection by a grid operator to reduce harmonics, as disclosed in U.S. Pat. No. 5,345,375.

However, other approaches with higher conversion efficiency and longer electronics lifetime are desirable.

SUMMARY

According to aspects illustrated here, there is a method of controlling a plurality of power converters in a power system including controlling switching times on the plurality of power converters receiving an input using a master controller, such that at least one of the plurality of power converters switches at a different time than at least one other of the plurality of power converters to provide a summation of outputs at a coupling point, and adjusting control signals from the master controller to each power converter to control the summation of the outputs to a desired output.

According to aspects illustrated here, there is a method of controlling a plurality of power converters in a power system including determining a base frequency, assigning an operating frequency to the power converters, wherein the operating frequency is a multiple of the base frequency, to each of the power converters, operating the plurality of power converters at the assigned frequencies, and summing the individual outputs of the power converters to produce an output.

According to aspects illustrated here, there is a method, of tuning a set of power converters including assigning switch times to each of the power converters so that at least one of the power converters switches at a different time than at least one other power converter, wherein updating the switch times does not require additional communications.

DETAILED DESCRIPTION OF THE EMBODIMENTS

As used here, the term 'power converter' means any device that converts between different types of power, either alternating current (AC) or direct current (DC). This may include inverters that convert from DC power sources such as solar panels or other alternative energy sources to AC. It may also include rectifiers that convert from AC to DC, such as electric vehicle or other battery chargers that require direct current, or AC to AC conversion such as variable speed motor drives.

Figure 1:
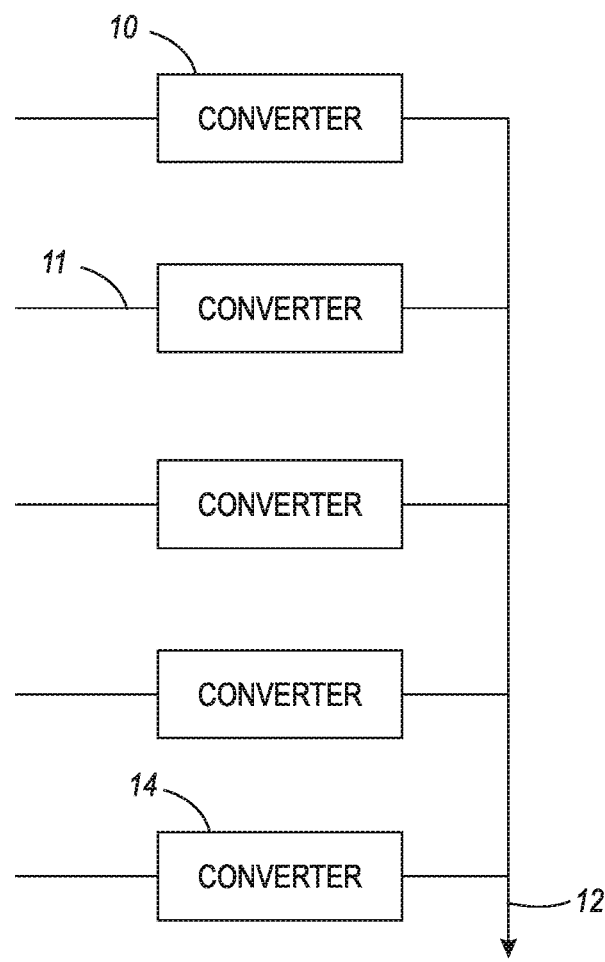
FIG. 1 shows an embodiment of an array of power converters with a common coupling point.

FIG. 1 shows an example of a set of power converters. The power converters such as converter 10 are arranged in an array of converters. The point of common coupling, typically the connection to the AC electrical grid, occurs at position 12. At the point of common coupling, it is often necessary to reduce THD below some limit, for example 4%. It may also be desirable for the power converters to inject/extract certain harmonics in order to reduce the overall total harmonic distortion in the grid. In such a case the intended injected power no longer has low THD. Each power converter such as 10 extracts (or injects) power from the point of common coupling and inject (or extracts) power into the position such as 11. The power at position 11 and 12 can either be AC or DC. For ease of understanding, the below discussion may focus on inverters with the understanding that no restriction to that particular implementation is intended nor should any be implied. The key unifying quality is the control of harmonics injected at the point of common coupling by tuning the pulse timings of the individual power converter.

In the first embodiment, the system has a master controller. The master controller may be incorporated into one of the converters, such as converter 14, or it may be a separate control component. In the embodiment of the control component, the converter 14 may take the form of a microcontroller, microprocessor, digital signal processor, etc.

Figure 2:
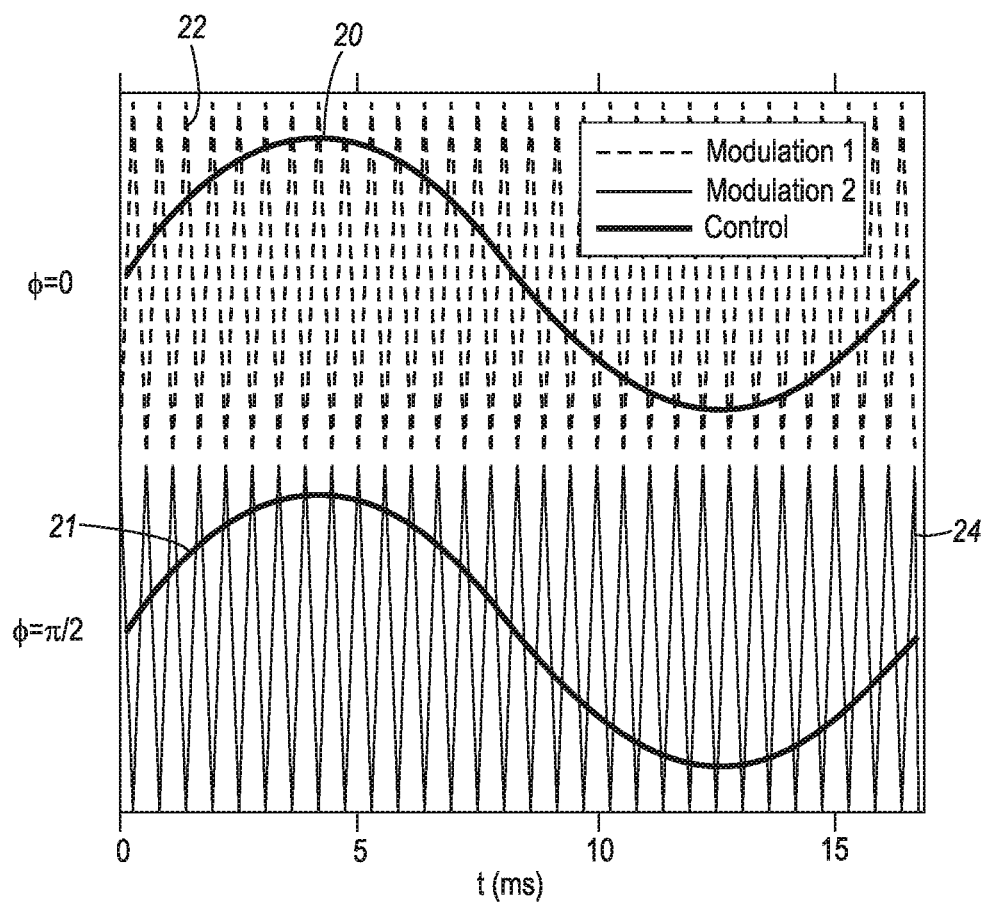
FIG. 2 shows graphical representation of determining the switch times a different phase offset of the modulation wave between two different power converters.
Figure 3:
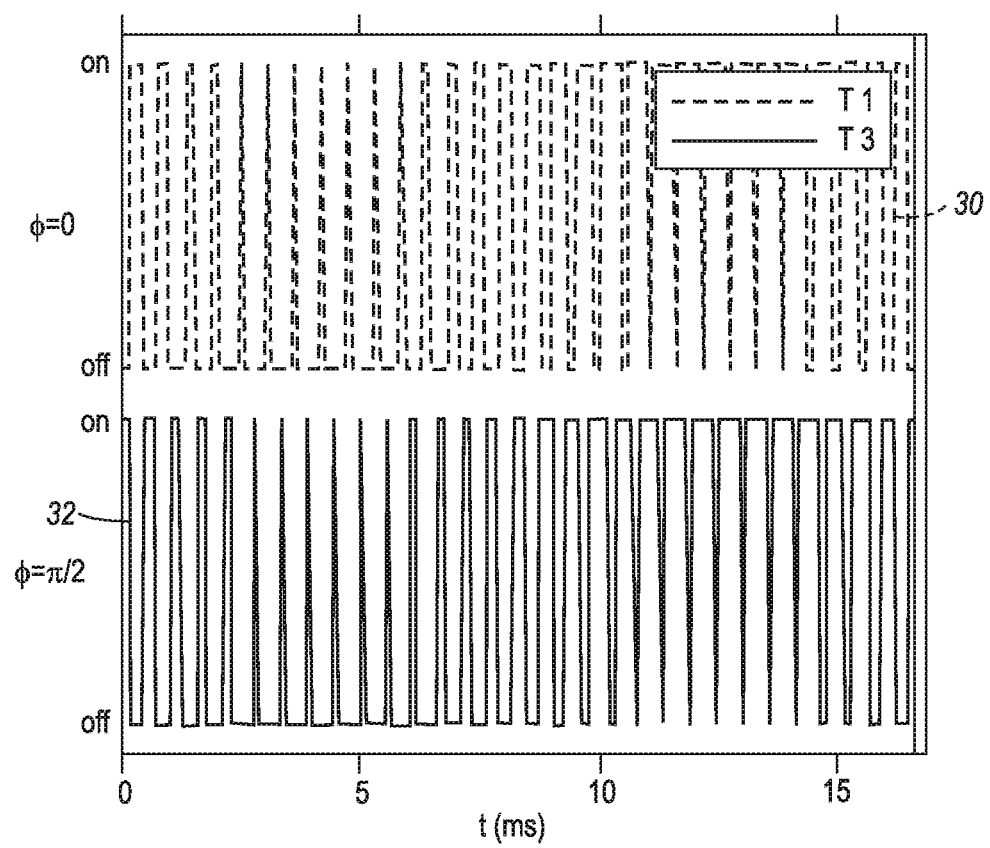
FIG. 3 shows the switch state for two different phase-offset power converters.
Figure 7:
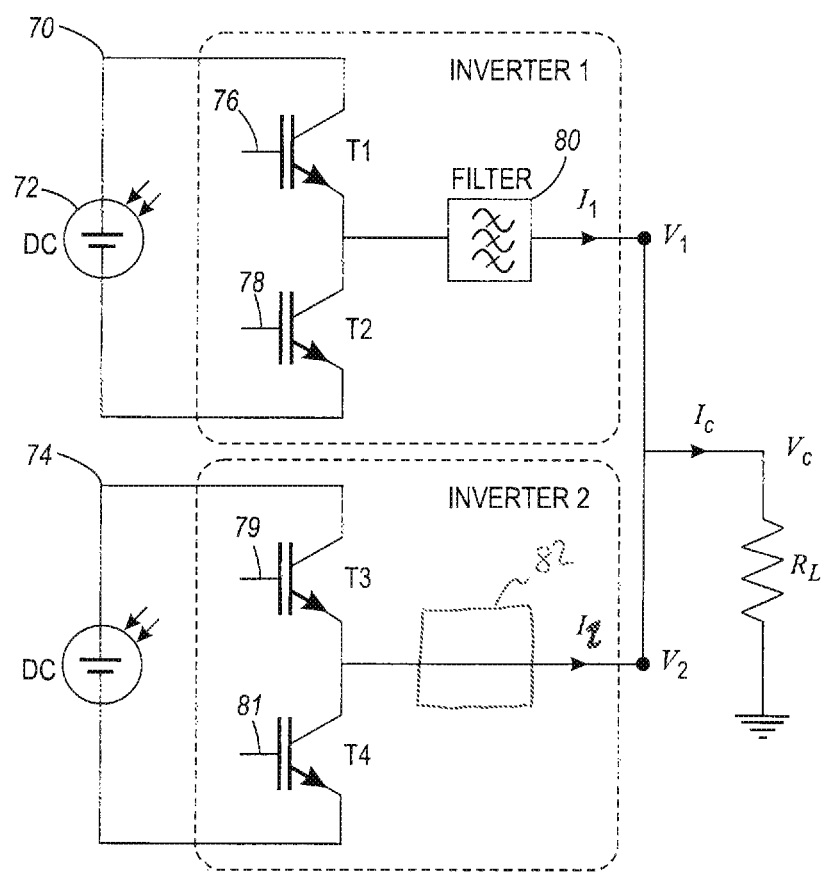
FIG. 7 shows a graphical representation of one phase of a two inverter system where the two inverters can operate with a different phase offset.

In operation, the master controller controls the phase offset of the modulation wave in each converter. While phase-offset control is presently described under the concept of pulse width modulation, it should be recognized that in general phase-offset control refers to any technique of controlling switch timings of multiple power converters. In phase-offset control, some inverters have a different phase offset for the modulation wave, as shown in FIG. 2. In the example of FIG. 7, the power converters consist of inverters, with each inverter connected to a DC power sources, such as a solar panel, etc. The desired output is an AC waveform, shown as control waveform 20. There may be multiple repetitions of this unit in order to provide three-phase power. The master controller sets the switching times for each inverter by finding the intersection points of the control waveform with the modulation waveform 22 and 24. This method is just one of many prior-art methods for generating precise switching times, and it is intended that any method of determining pulse switch times on individual inverters could be used. FIG. 3 shows the state of the transistors T1 76 and T3 78 in FIG. 7. Note that transistors T2 78 and T4 81 are switched oppositely to T1 76 and T3 79 respectively.

FIG. 2 shows the waveforms for one phase of a three-phase inverter system. Among other architectures, the inverters may consist of three-level inverters based on insulated-gate bipolar transistors (IGBT). Because of the use of phase-offset control, the inverter modulation frequency can be lowered from the typical value, around 20 KHz. This results in a lower number of commutations and hence lower switching losses in the transistors. This increased efficiency and lower heating rate results in a longer transistor lifetime due to reduced thermal stress from temperature cycles and mean temperature. In addition, since switching and conduction losses are typically traded off in the choice of a transistor, the embodiments enables inverters to use transistors with lower conduction losses as well.

The individual inverters determine a synchronized clock signal through local measurement of the AC voltage. Even though the voltage signal at the individual inverters may be distorted with high-frequency content due to the phase-offset technique, the zero-time of the base frequency can be found in software. This can be achieved by applying a low pass filter or a rolling mean filter on the measured voltage. This zero-time is then used by the individual inverters to provide a reference for adding a phase offset. This technique has the advantage that there is no long-term drift in the phase output from each inverter even if the inverter clocks are imperfect.

The master controller may communicate with the inverters through a local-area or wireless network. The master controller may monitor the grid voltage and the generated AC voltage from the inverters. The master controller optimizes the phase offset for each inverter. The master controller needs to robustly perform re-adjusting of the control schemes to take into account time-varying changes in module output power, such as partial shading in which one inverter produces lower output current.

In addition to the control scheme, the master controller manages communication with the individual inverters. The master controller may lose communication with one or more of the inverters, for example the loss of a keepalive signal. In one embodiment, if a keepalive signal is lost, all inverters may revert to a standard operating mode, such as producing sine waves using high-frequency PWM. This is to prevent the inverters from producing an output at the point of common coupling with high total harmonic distortion (THD). In one embodiment the master controller can operate an AC disconnect if the THD exceeds a set value.

In another embodiment, the master controller could send a query to each inverter to check communications. If a particular inverter fails to communicate with the master controller, that inverter may switch to normal PWM switching. The master controller may adjust the algorithm to that the remaining inverters output a re-optimized collaborative waveform.

The use of a master controller allows the ability to adjust the phases of the various inverters to produce a summed output with reduced THD and increased efficiency of operation. FIG. 2 show conventional PWM control, where inverter switch times are calculated from the intersection of a control signal 20 with a modulation wave 22. There are also other methods of determining the precise switch times to account for nonidealities in the inverter circuit.

FIG. 2 shows a control signal 20, and triangle modulation waves 22 and 24, that are phase offset from each other by 180 degrees. When the control signal 20 is greater than the modulation wave 22, the transistor T1 76 is "on" and T2 78 is "off" in FIG. 7. Similarly when the control signal 21 is greater than the modulation signal 24, the transistor T3 79 is "on" and T4 81 is "off." The PWM control signal applied to the inverter, which in one embodiment may be an IGBT half-bridge, is shown in FIG. 3. This causes the ripple output from the two inverters to be phase-offset from each other. With more than two inverters multiple different phase offsets other than 0 and 180 degrees could be applied to each inverter or to different phases.

Figure 4:
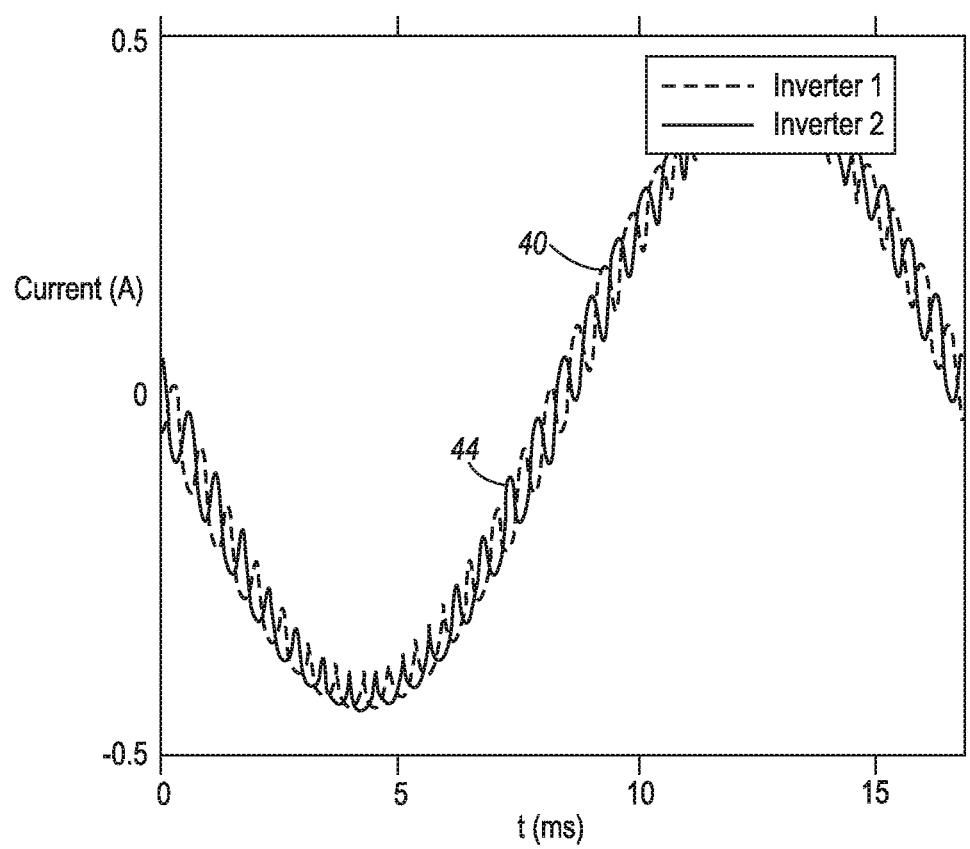
FIG. 4 shows the current output of each of the two different phase-offset power converters.
Figure 5:
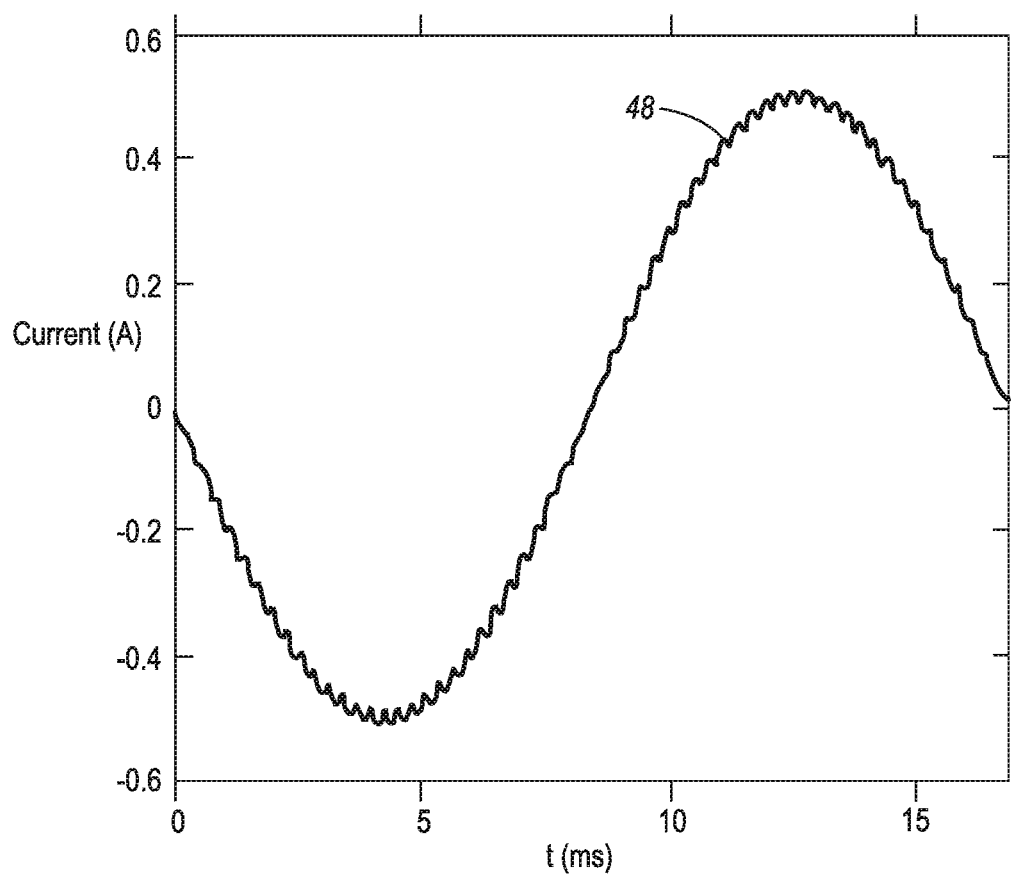
FIG. 5 shows the current output at the point of common coupling.

The current output from each inverter is shown in FIG. 4, with the output of modulation 30 being shown as output 40, the output of modulation 32 being shown at output 44. The current outputs in FIG. 4 individually have high total harmonic distortion. However, at the point of common coupling, the total THD is reduced. FIG. 5 shows the current at the point of common coupling 48. For two inverters with two different phase offsets the main ripple frequency is increased by a factor of two. For more inverters with more different phase offsets, the ripple frequency is increased further.

Figure 6:
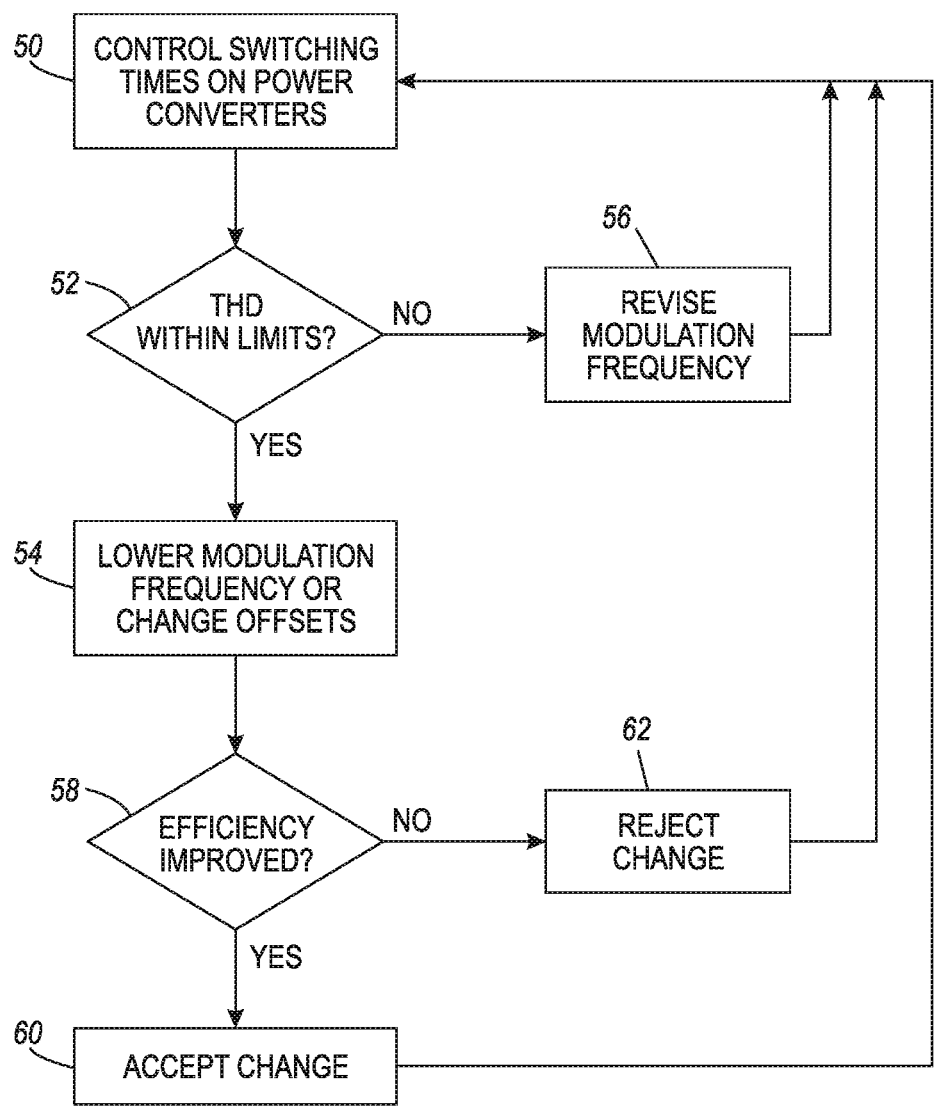
FIG. 6 shows a method for controlling a plurality of power converters to increase efficiency while keeping THD within limits.

With the use of a master controller, one can set up coordinated phase-offset between the various power converters to ensure high efficiency conversion and low total harmonic distortion. Alternatively, one can set up the power converters with a predetermined modulation frequency, such as a multiple of a base frequency. In either case, the switching on the power converters is controlled to provide more efficient switching with lower THD. FIG. 6 shows an embodiment of a method of controlling power converters.

In the embodiment using a master controller, the master controller controls the switching times on the power converters at 50. The switching times are initially set using phase offset, but the master controller can adjust operation as needed to get the desired output at 52. This may involve monitoring the THD and adjusting operations as needed to ensure that it stays below a desired level. The adjustment may be increasing the modulation frequencies at 54 until the THD is within limits.

Another adjustment that may occur, as discussed above, is when communications are lost between the master controller and any of the converters. Communications may be lost if one converter does not respond to the master controller, or if the master controller lacks acknowledgement of a signal from the power converter. If the communications are lost, the master controller may adjust operations of the remaining converters at 56 to ensure that efficiency remains high and THD remains low. As shown in FIG. 6, this may involve adjusting the operating frequency of the converters at 58, or it may cause the master controller to disconnect the converter with which it has lost communications and cause it to go back to 'normal' or standard PWM operations at 59.

In the embodiment where no master controller exists, the method only involves the control of the switching times on the power converters. In this embodiment, the power converters could have preset modulation frequencies and phases which are some multiple of a base frequency. For example, if the base frequency is 60 Hz, the modulation frequency for one inverter may be 300 Hz and a phase offset of 0, and on another 300 Hz with a phase offset of 180 degrees.

It is also possible to use different modulation frequencies on different power converters. This allows conventional PWM techniques to be used, but because the power converters modulate at different frequencies, the intersection between their modulation frequency and the control signal will vary, allowing control of the THD, while maintaining efficiency.

In order to synchronize timing between power converters without extra communication each converter can determine the local zero-crossing point using phase determination techniques. This may be accomplished in software by recording the local inverter voltage and finding the phase of the Fourier transform at 60 Hz. This allows the inverters to synchronize clocks using only a measure of the local, possibly-distorted waveform.

The multiple power converters may be pre-programmed with either a fixed phase-offset and modulation frequency, or with one that is chosen differently from some defined distribution upon a power-up of the power converter. In the case that the phase-offset is chosen from some random distribution upon startup, there is no extra communication overhead required in order to choose a new phase offset. In one embodiment, when the power converters have their power cycled, each power converter chooses a phase-offset from a preset distribution. In this way an operator can reset all the phase-offsets without having a separate communication channel to each power converter. In another embodiment, each power cycle toggles the power converters through predefined settings. In this way, the THD created by the power converters can be modified with any addition communication requirements.

The embodiment of the master controller and real-time adjustments and the embodiment of the preset multiples of a base frequency may apply to systems of power converters, where the power converters consist of inverters from DC to AC, or the power converters consist of rectifiers from AC to DC, or variable speed drives converting AC to AC. FIG. 7 shows an example of an inverter.

FIG. 7 shows two half-bridge inverters 70 and 74 connected in parallel. Output power sums at the coupling point $V_c$. The power source, such as a solar panel, DC/DC converters, capacitors, etc. are included in the block marked DC 64. The transistors 76 and 78 may switch oppositely to avoid shorting the DC source. In this embodiment there is a low pass filter, in this case an LCL low pass filter 80 and 82. The output power sums at $V_c$ and is drawn by the load resistor $R_L$.

In the case of the master controller, the master controller would set the modulation of each of these inverters to be phase-offset from each other and then adjust as necessary to ensure THD remained within limits. Where there is no master controller, the modulation frequencies of each of the inverters would be set to be a multiple of the base frequency.

Figure 8:
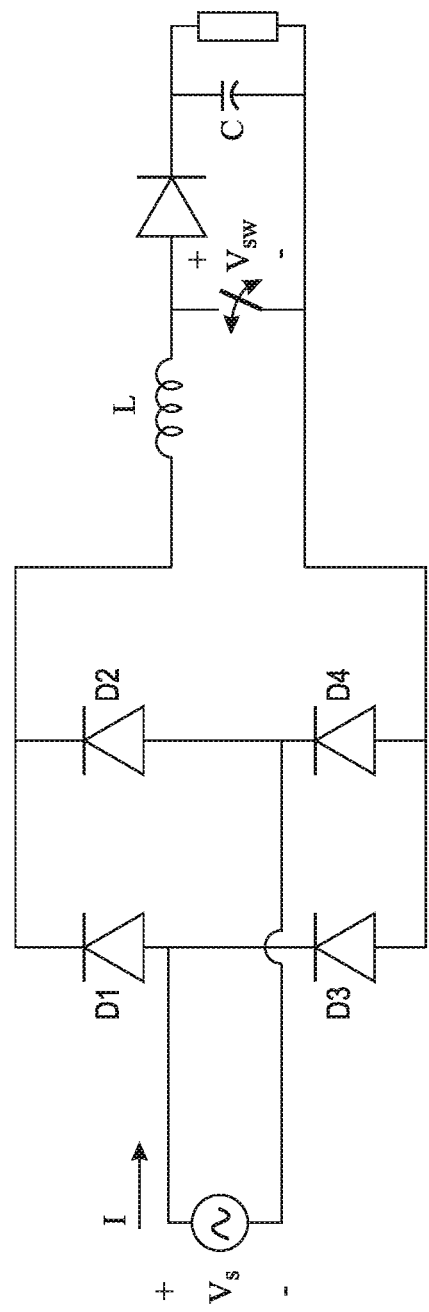
FIG. 8 shows an embodiment in which a power converter is a rectifier.

FIG. 8 shows an example of the power converter being a rectifier, and in this particular embodiment, a unity power rectifier. In the embodiment of FIG. 8, the rectifier load can be controlled through the switching voltage at the switch $V_{sw}$, where the switching voltage is controlled by the combination of control signal and modulation frequency signal. This may be set and monitored by the master controller, or preset according to a multiple of a base frequency. In either case, the rectifier is one in a set of multiple rectifiers from an AC source to serve multiple DC loads.

In this manner, the overall efficiency can be increased and the THD can be decreased or controlled in a power converter system.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method of controlling a plurality of power converters in a power system, comprising:
controlling switching times on the plurality of power converters receiving an input using a master controller, such that at least one of the plurality of power converters switches at a different time than at least one other of the plurality of power converters to provide a summation of outputs at a coupling point;
adjusting control signals from the master controller to each power converter to control the summation of the outputs to a desired output waveform;
determining that the master controller has lost communications with at least one power converter; and
reverting the at least one power converter to operate using standard pulse width modulation.

2. The method of claim 1, wherein adjusting control signals from the master controller comprises monitoring total harmonic distortion in the power system and adjusting at least one of operating frequencies or switching times of the power converters to control the total harmonic distortion.

3. The method of claim 1, wherein the power converters comprise inverters, the method further comprising determining, at each inverter, a zero-crossing point of a modulation signal for the inverter.

4. The method of claim 1, further comprising periodically sending a signal from the master controller to each power converter to confirm communications.

5. The method of claim 1, further comprising adjusting, at the master controller, operations of the other power converters that do not revert to standard pulse width modulation to output the desired output.

6. The method of claim 1, wherein the power converters comprise inverters receiving a direct current input and outputting an alternating current output.

7. The method of claim 1, wherein the power converters comprise rectifiers receiving an alternating current input and producing a direct current output.

8. The method of claim 7, wherein the master controller assigns the switching time to at least one transistor in the rectifiers.

9. The method of claim 1, wherein the master controller is a separate component.

10. The method of claim 1, wherein the master controller is one of the plurality of power converters and is the power converter closest to the coupling point.

11. A method of controlling a plurality of power converters in a power system, comprising:

determining a base frequency;

assigning an operating frequency to the power converters, wherein the operating frequency is a multiple of the base frequency, to each of the power converters;

operating the plurality of power converters at the assigned operating frequencies;

determining an intersection point of a modulation signal for each power converter with a control signal to determine a pulse width modulation signal for each power converter; and summing individual outputs of the power converters to produce an output.

12. The method of claim 11, wherein the power converters comprise inverters, the method further comprising determining, at each inverter, a zero-crossing point of a modulation signal for each inverter.

13. The method of claim 11, wherein the power converters comprise rectifiers.

\* \* \* \* \*